United States Patent
Chang et al.

(10) Patent No.: US 11,201,158 B2
(45) Date of Patent: Dec. 14, 2021

(54) SRAM STRUCTURE

(71) Applicant: Taiwan Semiconductor Manufacturing Co., Ltd., Hsinchu (TW)

(72) Inventors: Feng-Ming Chang, Zhubei (TW); Chia-Hao Pao, Kaohsiung (TW); Lien-Jung Hung, Taipei (TW); Ping-Wei Wang, Hsinchu (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

(21) Appl. No.: 16/921,173

(22) Filed: Jul. 6, 2020

(65) Prior Publication Data

US 2020/0335508 A1 Oct. 22, 2020

Related U.S. Application Data

(62) Division of application No. 15/953,818, filed on Apr. 16, 2018, now Pat. No. 10,714,484.

(60) Provisional application No. 62/591,273, filed on Nov. 28, 2017.

(51) Int. Cl.
| | | |
|---|---|---|
| H01L 27/11 | (2006.01) | |
| H01L 27/02 | (2006.01) | |
| H01L 29/06 | (2006.01) | |
| G11C 11/417 | (2006.01) | |
| G11C 11/412 | (2006.01) | |

(52) U.S. Cl.
CPC ...... *H01L 27/1104* (2013.01); *H01L 27/0207* (2013.01); *H01L 29/0615* (2013.01); *H01L 29/0692* (2013.01); *G11C 11/412* (2013.01); *G11C 11/417* (2013.01); *H01L 29/0619* (2013.01); *H01L 29/0696* (2013.01)

(58) Field of Classification Search
CPC . H01L 27/0207; H01L 27/0928; H01L 27/11; H01L 27/1104; H01L 29/06; H01L 29/0615; H01L 29/0619; H01L 29/0692
USPC .......................................................... 257/371
See application file for complete search history.

(56) References Cited

U.S. PATENT DOCUMENTS

| | | | |
|---|---|---|---|
| 8,975,707 B2* | 3/2015 | Ohtsuka | H01L 29/0847 257/371 |
| 2006/0197110 A1 | 9/2006 | Sugahara et al. | |
| 2014/0159160 A1* | 6/2014 | Tamaru | H01L 27/11807 257/371 |

(Continued)

*Primary Examiner* — Matthew E Warren
(74) *Attorney, Agent, or Firm* — McClure, Qualey & Rodack, LLP

(57) ABSTRACT

An SRAM structure is provided. The SRAM structure includes a plurality of first well regions with a first doping type, a second well region with a second doping type, a plurality of first well pick-up regions, a plurality of second well pick-up regions and a plurality of memory cells. The first well regions are formed in a semiconductor substrate. The second well region is formed in the semiconductor substrate. The first well pick-up regions are formed in the first well regions. The second well pick-up regions are formed in the second well region. Each of the memory cells is disposed on two adjacent first well regions and a portion of the second well region between the two adjacent first well regions. Each of the first well pick-up regions is disposed between two adjacent second well pick-up regions.

20 Claims, 8 Drawing Sheets

(56) References Cited

U.S. PATENT DOCUMENTS

| | | | |
|---|---|---|---|
| 2014/0177312 A1* | 6/2014 | Shibata | G11C 11/417 |
| | | | 365/72 |
| 2014/0191328 A1* | 7/2014 | Tsuruta | H01L 21/823878 |
| | | | 257/371 |
| 2016/0322345 A1* | 11/2016 | Lee | H01L 27/088 |
| 2018/0331102 A1 | 11/2018 | Kanno et al. | |

* cited by examiner

SRAM STRUCTURE

CROSS REFERENCE TO RELATED APPLICATIONS

This application is a Divisional of U.S. application Ser. No. 15/953,818, filed on Apr. 16, 2018, which claims priority of U.S. Provisional Application No. 62/591,273, filed on Nov. 28, 2017, the entirety of which are incorporated by reference herein.

BACKGROUND

Memories are commonly used in integrated circuits. For example, a static random access memory (SRAM) is a volatile memory, and is used for electronic applications where high speed, low power consumption and simple operations are applicable. Embedded SRAM is particularly popular in high-speed communications, image processing, and system on chip (SOC) applications. SRAM has the advantageous feature of being able to hold data without requiring a refresh.

SRAM includes a plurality of bit cells disposed in rows and columns to form an array. Each bit cell includes a plurality of transistors coupled to bit lines and word lines that are used to read and write a bit of data to the memory cell. Single-port SRAMs enable a single bit of data to be written to or read from a bit cell at a particular time.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
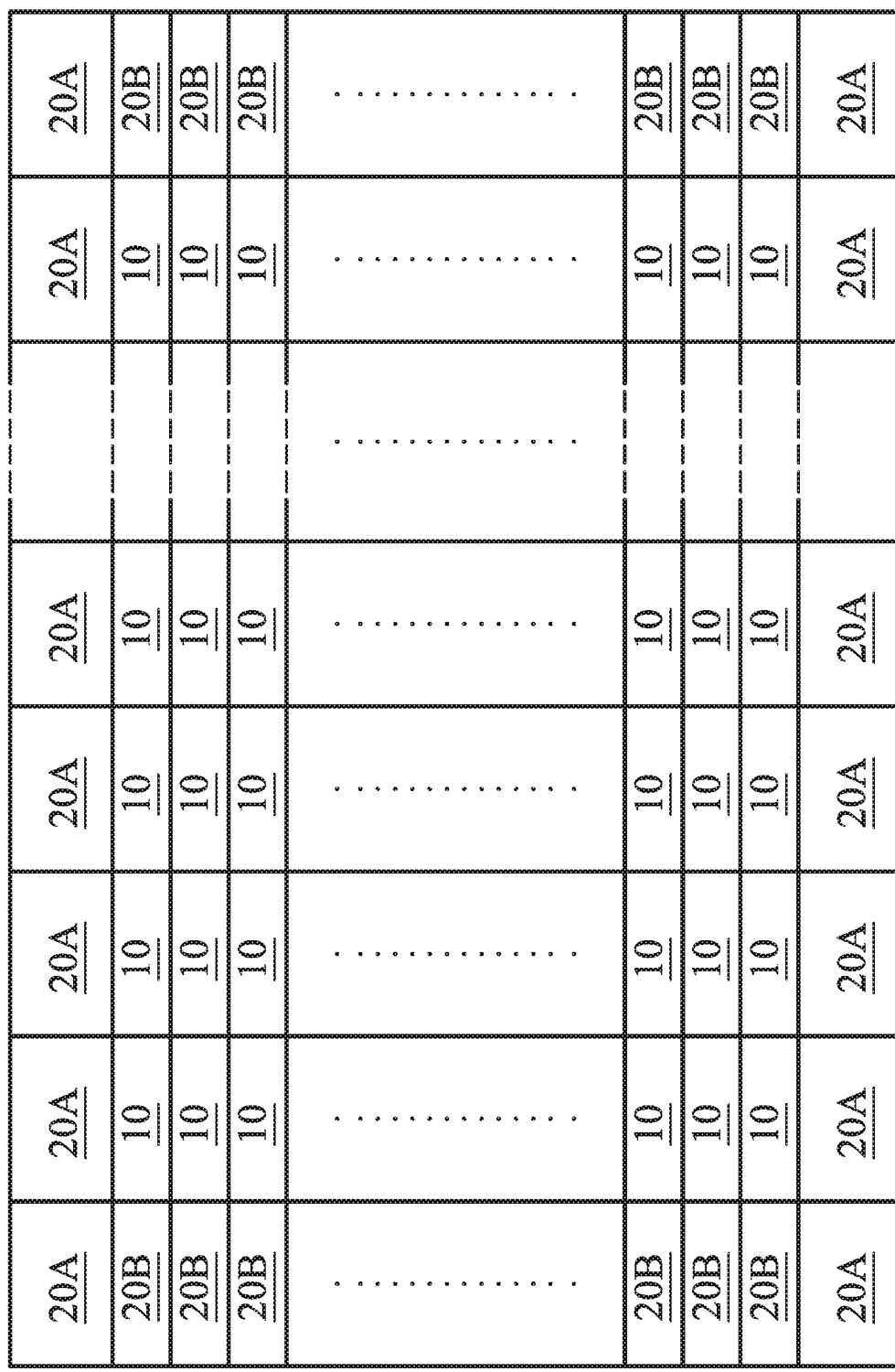
FIG. 1 shows a simplified diagram of an SRAM, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various static random access memory (SRAM) structures are provided in accordance with various exemplary embodiments. Some variations of some embodiments are discussed. Throughout the various views and illustrative embodiments, like reference numbers are used to designate like elements.

FIG. 1 shows a simplified diagram of an SRAM 30, in accordance with some embodiments of the disclosure. The SRAM 30 is a memory array and is implemented in an integrated circuit (e.g. System on Chip (SOC)). The SRAM 30 includes a cell array formed by multiple SRAM cells (or called bit cells) 10, and the SRAM cells 10 are arranged in multiple rows and multiple columns. Each SRAM cell 10 is a bit cell, such as a six-transistor (6T), 8T, 10T cell and so on.

In fabrication of the SRAM cells, the cell array may be separated by multiple edge cells 20A and multiple edge cells 20B. The edge cells 20A are dummy cells arranged in the upper and lower side of the cell array, and the edge cells 20B are dummy cells arranged in the left and right side of the cell array. For example, the edge cells 20A are arranged to surround the cell array in a row direction, and the edge cells 20B are arranged to surround the cell array in a column direction. In some embodiments, the edge cells 20A are the strap cells.

The shapes and sizes of the edge cells 20A and 20B are determined according to actual applications. In some embodiments, the shapes and sizes of the edge cells 20A and 20B are the same as the SRMA cells 10. In some embodiments, the shapes and sizes of the edge cells 20A and 20B and the SRAM cells 10 are different.

Figure 2A:
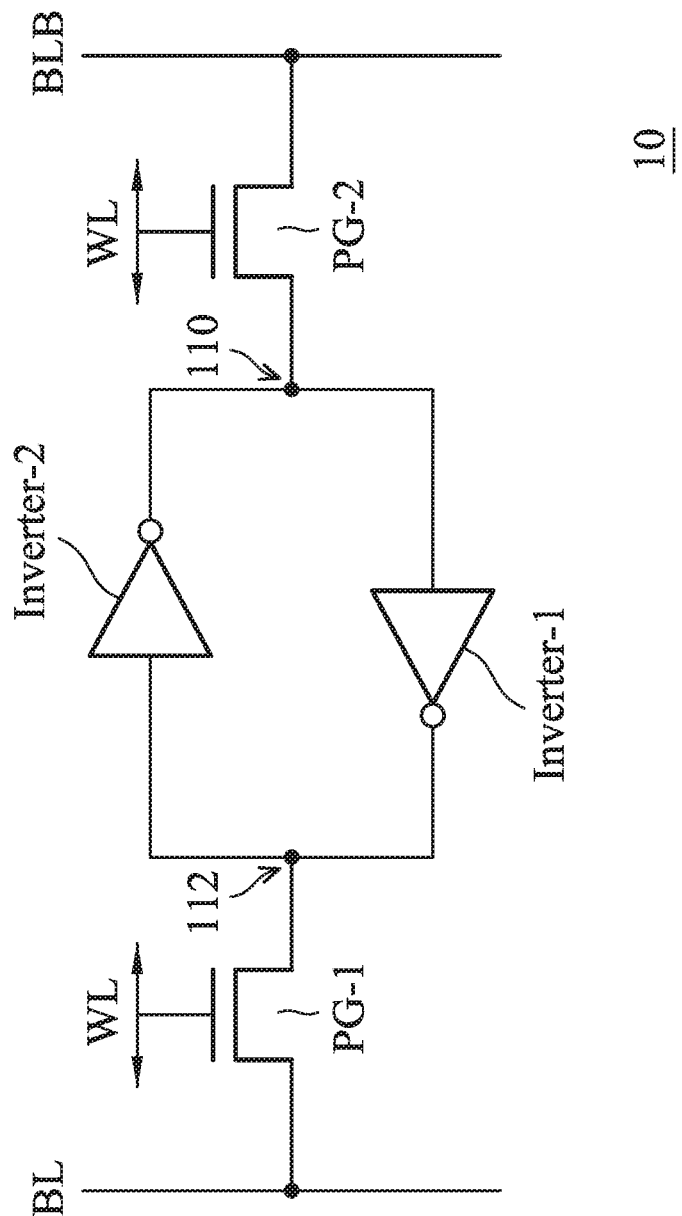
FIG. 2A shows a single-port SRAM cell, in accordance with some embodiments of the disclosure.

FIG. 2A shows a single-port SRAM cell 10, in accordance with some embodiments of the disclosure. The SRAM cell 10 includes a pair of cross-coupled inverters Inverter-1 and Inverter-2, and two pass-gate transistors PG-1 and PG-2. The inverters Inverter-1 and Inverter-2 are cross coupled between the nodes 112 and 110, and form a latch. The pass-gate transistor PG-1 is coupled between a bit-line BL and the node 112, and the pass-gate transistor PG-2 is coupled between a complementary bit line BLB and the node 110. The complementary bit line BLB is complementary to the bit line BL. The gates of the pass-gate transistors PG-1 and PG-2 are coupled to the same word-line WL. Furthermore, the pass-gate transistors PG-1 and PG-2 are NMOS transistors.

The transistors of the SRAM cell 10 may be planar transistors or non-planar (e.g., fin) transistors. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 2B:
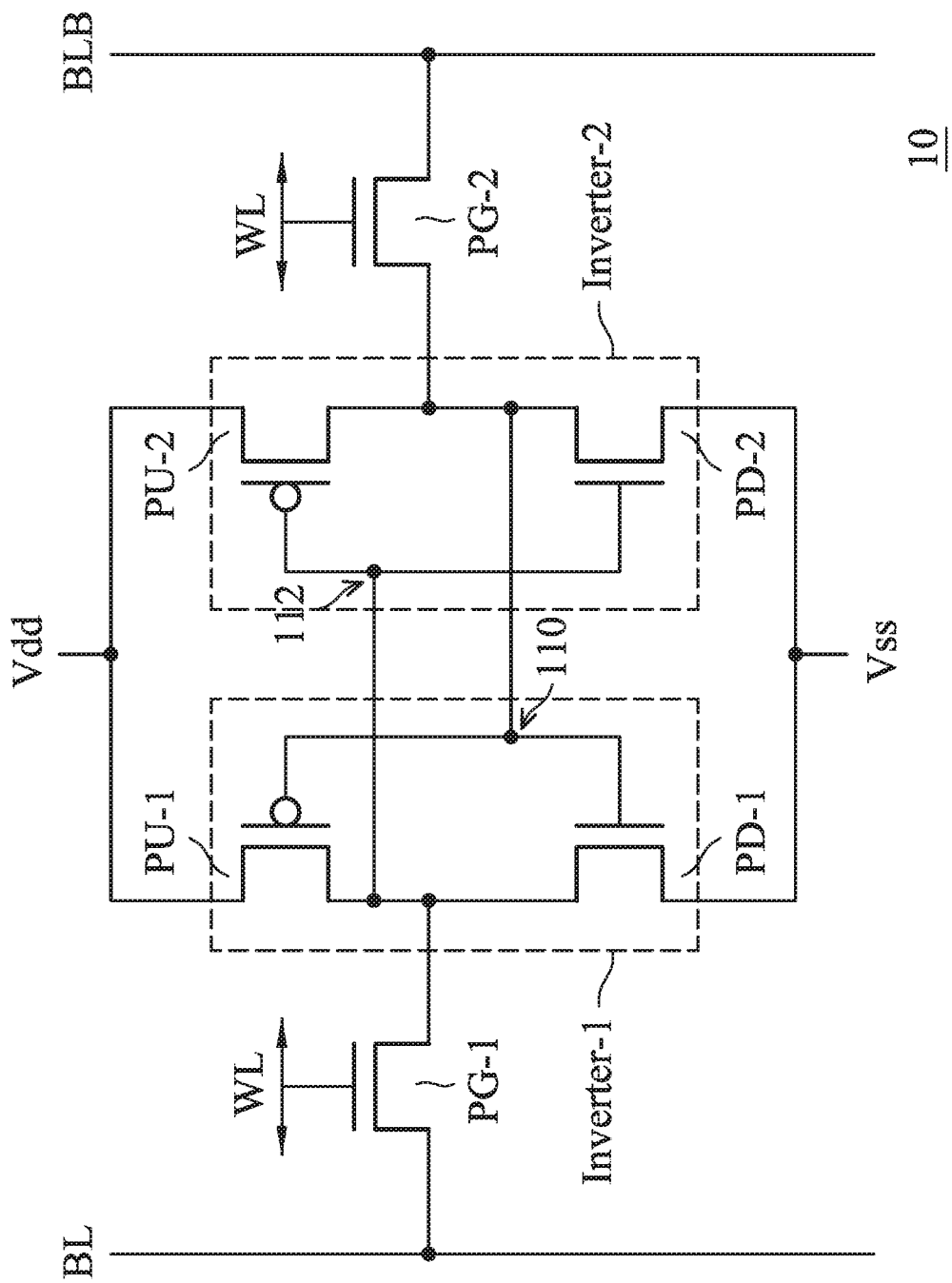
FIG. 2B shows a simplified diagram of the SRAM cell of FIG. 2A, in accordance with some embodiments of the disclosure.

FIG. 2B shows a simplified diagram of the SRAM cell 10 of FIG. 2A, in accordance with some embodiments of the disclosure. The inverter Inverter-1 includes a pull-up transistor PU-1 and a pull-down transistor PD-1. The pull-up transistor PU-1 is a PMOS transistor, and the pull-down transistor PD-1 is an NMOS transistor. The drain of the pull-up transistor PU-1 and the drain of the pull-down transistor PD-1 are coupled to the node 112 connecting the pass-gate transistor PG-1. The gates of the pull-up transistor PU-1 and the pull-down transistor PD-1 are coupled to the node 110 connecting the pass-gate transistor PG-2. Furthermore, the source of the pull-up transistor PU-1 is coupled to the positive power supply node Vdd, and the source of the pull-down transistor PD-1 is coupled to a ground Vss.

Similarly, the inverter Inverter-2 includes a pull-up transistor PU-2 and a pull-down transistor PD-2. The pull-up transistor PU-2 is a PMOS transistor, and the pull-down transistor PD-2 is an NMOS transistor. The drains of the pull-up transistor PU-2 and the pull-down transistor PD-2 are coupled to the node 110 connecting the pass-gate transistor PG-2. The gates of the pull-up transistor PU-2 and the pull-down transistor PD-2 are coupled to the node 112 connecting the pass gate transistor PG-1. Furthermore, the source of the pull-up transistor PU-2 is coupled to the positive power supply node Vdd, and the source of the pull-down transistor PD-2 is coupled to the ground Vss.

Figure 3:
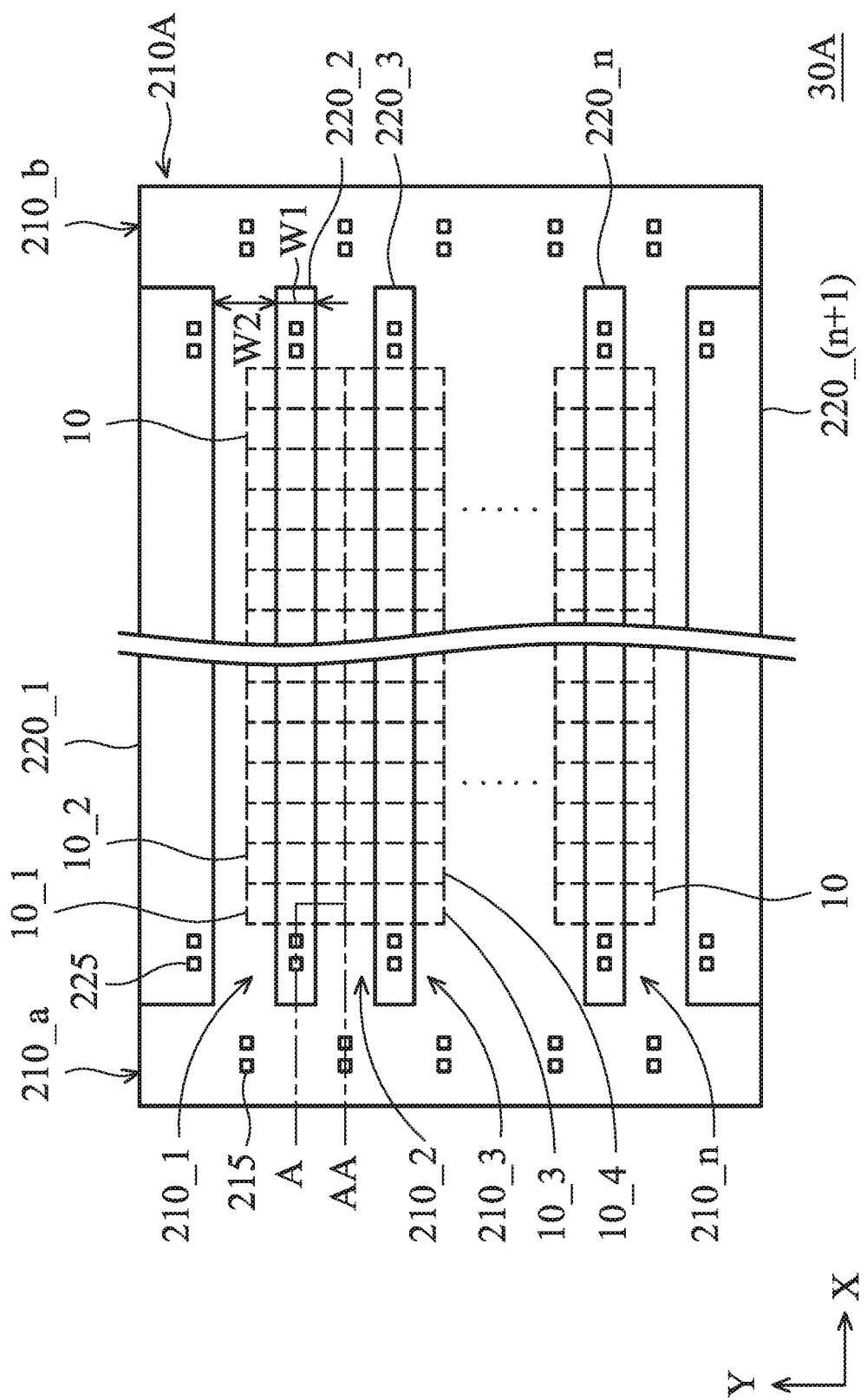
FIG. 3 shows a schematic top view of an SRAM structure including a plurality of layers involved in the SRAM of FIG. 1, in accordance with some embodiments of the disclosure.

FIG. 3 shows a schematic top view of an SRAM structure 30A including a plurality of layers involved in the SRAM 30 of FIG. 1, in accordance with some embodiments of the disclosure. The layers of FIG. 3 are formed on a semiconductor substrate.

The SRAM structure 30A includes a P-well region 210A, multiple N-well regions 220_1 through 220_(n+1), and multiple SRAM cells 10. The P-well region 210A has a ladder-shape in top view, and the ladder-shaped P-well region 210A is divided into the P-well sub-regions 210_1 through 210_n and the P-well sub-regions 210_a and 210_b.

The P-well sub-regions 210_1 through 210_n and the N-well regions 220_1 through 220 (n+1) are formed in a semiconductor substrate, and extend parallel in a X-direction. The SRAM cells 10 are formed on the P-well sub-regions 210_1 through 210_n and the N-well regions 220_2 through 220_n. Furthermore, a quantity of P-well sub-regions 210_1 through 210_n and a quantity of N-well regions 220_1 through 220 (n+1) shown in FIG. 3 are merely an example and is not intended to be limiting the actual structure of the SRAM 30. In order to simplify the description, the edge cells 20A and 20B will be omitted in FIG. 3.

The P-well sub-regions 210_1 through 210_n and the N-well regions 220_1 through 220 (n+1) are interlaced in the semiconductor substrate. For example, the P-well sub-region 210_1 is arranged between the N-well regions 220_1 and 220_2, and the P-well sub-regions 210_2 is arranged between the N-well regions 220_2 and 220_3, and so on. Moreover, the N-well region 220_2 is arranged between the P-well sub-regions 210_1 and 210_2, and the N-well region 220_3 is arranged between the P-well sub-regions 210_2 and 210_3, and so on.

The P-well sub-regions 210_a and 210_b are formed in the semiconductor substrate, and extend parallel in a Y-direction. Specifically, the P-well sub-regions 210_a and 210_b are perpendicular to the P-well sub-regions 210_1 through 210_n. Furthermore, the P-well sub-region 210_a is adjacent to the left side of the P-well sub-regions 210_1 through 210_n, and the P-well sub-region 210_b is adjacent to the right side of the P-well sub-regions 210_1 through 210_n.

In some embodiments, the N-well regions 220_2 through 220_n have the same width W1, and the P-well sub-regions 210_1 and 220_n have the same width W2 in top view, where W2>W1. In some embodiments, the N-well regions 220_2 through 220_n and the P-well sub-regions 210_1 and 220_n have the same width, e.g., W2=W1. Further the N-well regions 220_1 through 220 (n+1) and the P-well sub-regions 210_1 and 210_n have the same length in top view.

In the SRAM structure 30A, each of the N-well regions 220_2 through 220_n is surrounded by the ladder-shaped P-well region 210A. For example, the N-well region 220_2 is surrounded by the P-well sub-regions 210_1, 210_b, 210_2 and 210_a of the ladder-shaped P-well region 210A, the N-well region 220_3 is surrounded by the P-well sub-regions 210_2, 210_b, 210_3 and 210_a of the ladder-shaped P-well region 210A, and so on. Specifically, the N-well regions 220_2 through 220_n are separated from each other by the ladder-shaped P-well region 210A.

The SRAM structure 30A further includes multiple N-well pick-up regions 225 on the N-well regions 220_1 through 220_(n+1). Each N-well pick-up region 225 is an electrical connection made by one or more N-well contacts. The N-well contact is configured to connect to a positive voltage supply, such as a power supply node Vdd. In such embodiments, the N-well pick-up regions 225 are arranged on both sides of the corresponding N-well region for each of the N-well regions 220_1 through 220_(n+1).

The SRAM structure 30A further includes multiple P-well pick-up regions 215. Each P-well pick-up region 215 is an electrical connection made by one or more P-well contacts. The P-well contact is configured to connect to a ground terminal, such as a ground Vss. For the ladder-shaped P-well region 210A, the P-well pick-up regions 215 are arranged on the P-well sub-regions 210_a and 210_b. Furthermore, the P-well pick-up regions 215 are shared by the P-well sub-regions 210_a and 210_b and the P-well sub-regions 210_1 through 210_n. In some embodiments, no P-well pick-up regions 215 is arranged on the P-well sub-regions 210_1 through 210_n.

In such embodiments, each SRAM cell 10 includes a central N-well region and two adjacent P-well regions on opposing sides of the central N-well region. For example, talking the SRAM cell 10_1 as an example for illustration, the central N-well region is the N-well region 220_2, and the two adjacent P-well regions are the P-well sub-regions 210_1 and 210_2. Furthermore, the pull-up transistors PU-1 and PU-2 are formed on the N-well region 220_2, and the pass-gate transistors PG-1 and PG-2 and the pull-down transistors PD-1 and PD-2 are formed on the P-well sub-regions 210_1 and 210_2.

In some embodiments, more P-well pick-up regions 215 are arranged in the P-well sub-regions 210_a and 210_b. Thus, in the SRAM structure 30A, the number of P-well pick-up regions 215 is greater than that of the N-well pick-up regions 225.

Figure 4:
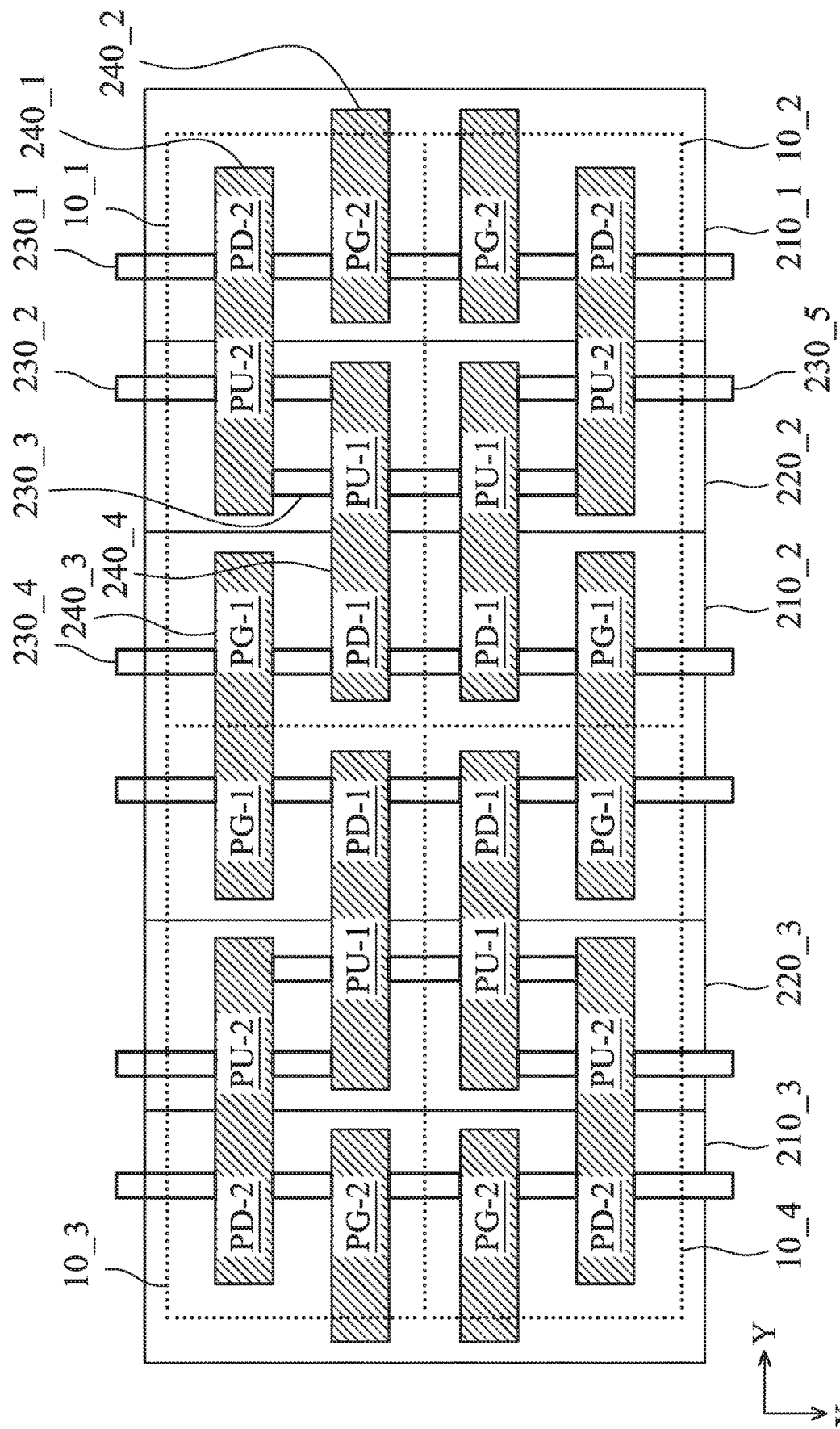
FIG. 4 shows a layout illustrating the SRAM cells of FIG. 3, in accordance with some embodiments of the disclosure.

FIG. 4 shows a layout illustrating the SRAM cells 10_1, 10_2, 10_3 and 10_4 of FIG. 3, in accordance with some embodiments of the disclosure. In such embodiments, the transistors within the SRAM cells 10_1, 10_2, 10_3 and 10_4 are fin transistors.

In SRAM cell 10_1, the pass-gate transistor PG-1 is formed at the cross point of the fin 230_4 and the poly 240_3 on the P-well sub-region 210_2. The pull-down transistor PD-1 is formed at the cross point of the fin 230_4 and the poly 240_4 on the P-well sub-region 210_2. The pass-gate transistor PG-2 is formed at the cross point of the fin 230_1 and the poly 240_2 on the P-well sub-region 210_1. The pull-down transistor PD-2 is formed at the cross point of the fin 230_1 and the poly 240_1 on the P-well sub-region 210_1. The pull-up transistor PU-1 is formed at the cross point of the fin 230_3 and the poly 240_4 on the N-well region 220_2. The pull-up transistor PU-2 is formed at the cross point of the fin 230_2 and the poly 240_1 on the N-well region 220_2.

Various contacts and their corresponding interconnect vias may be employed to couple components in each SRAM cell 10. Through a via and a gate contact, a word line (WL) contact (not shown) may be coupled to the gate of pass-gate transistor PG-1, and another word line contact WL is coupled to the gate of pass-gate transistor PG-2. Likewise, a bit line (BL) contact (not shown) is coupled to the drain of pass-gate transistor PG-1, and a complementary bit line contact BLB is coupled to the drain of pass-gate transistor PG-2.

A power source contact (not shown) coupled to the power supply node Vdd is coupled to the source of the pull-up transistor PU-1, and another power source contact coupled to the power supply node Vdd is coupled to the source of the pull-up transistor PU-2. A ground contact coupled to the ground terminal Vss is coupled to the source of the pull-down transistor PD-1, and another ground contact coupled to the ground terminal Vss is coupled to the source of the pull-down transistor PD-2.

In such embodiments, the SRAM cell 10_2 is a duplicate cell for the SRAM cell 10_1 but flipped over the Y axis. Furthermore, the SRAM cell 10_3 is a duplicate cell for the SRAM cell 10_1 but flipped over the X axis. Moreover, the SRAM cell 10_4 is a duplicate cell for the SRAM cell 10_3 but flipped over the Y axis. The common contacts (e.g., BL, Vdd, and Vss), are combined to save space.

Figure 5:
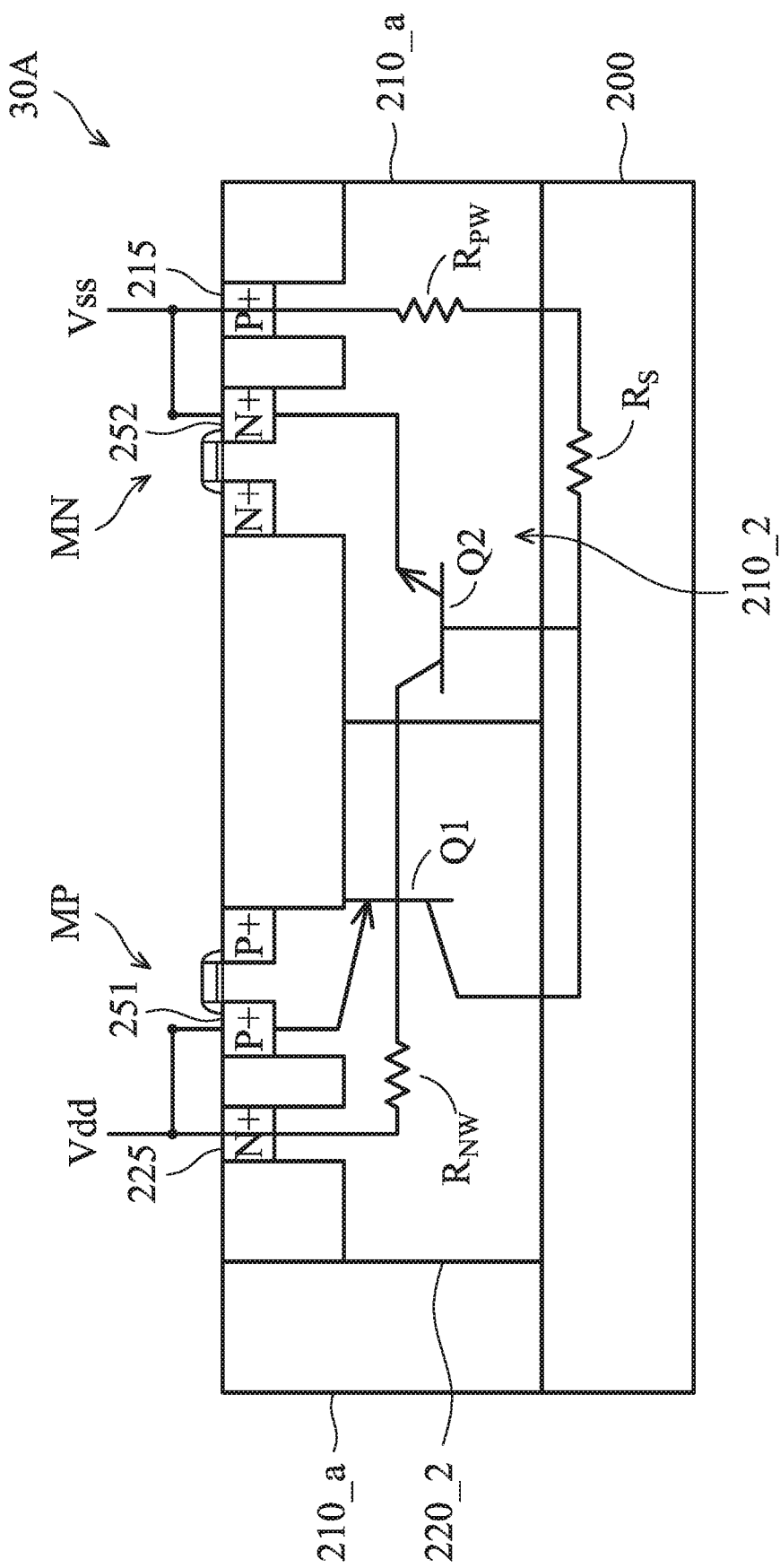
FIG. 5 shows a cross-sectional view of the SRAM structure along section line A-AA view of FIG. 3.

FIG. 5 shows a cross-sectional view of the SRAM structure 30A along section line A-AA view of FIG. 3.

In FIG. 5, the P-well sub-regions 210_a and 210_2 and the N-well region 220_2 are formed on a P-type substrate 200. A PMOS transistor MP is formed on the N-well region 220_2, and an NMOS transistor MN is formed on the P-well region 210_2. Furthermore, the N-well pick-up region 225 forms bulk terminal of the PMOS transistor MP, and the P-well pick-up region 215 forms bulk terminal of the NMOS transistor MN.

In such embodiments, the PMOS transistor MP and the NMOS transistor MN are planar transistors. Furthermore, the PMOS transistor MP may be the pull-up transistor PU-1 or PU-2 of the SRAM cell 10_1, and the NMOS transistor MN may be the pass-gate transistor PG-1 or PG-2 or the pull-down transistor PD-1 or PD-2 of the SRAM cell 10_1.

A parasitic PNP transistor Q1 is shown with an emitter formed by the P+ region 251 (i.e., source of the PMOS transistor MP), a base formed by the N-well region 220_2, and a collector formed by the P-substrate 200 and the P-well sub-region 210_a. The base of the PNP transistor Q1 is coupled to the N-well pick-up region 225 through the resistor RNw. The N-well pick-up region 225 is an electrical connection made by an N-type doped region on the N-well region 220_2, and the N-well pick-up region 225 is configured to connect to a power supply node Vdd. The resistor RNw is a parasitic component (intrinsic resistance) of the N-well region 220_2. The collector of the PNP transistor Q1 is coupled to the P-well pick-up region 215 through the resistors $R_S$ and $R_{PW}$. The P-well pick-up region 215 is an electrical connection made by a P-type doped region on the P-well sub-region 210_a, and the P-well pick-up region 215 is configured to connect to a ground terminal Vss. The resistors $R_S$ and $R_{PW}$ are parasitic components (intrinsic resistances) of the P-type substrate 200 and the P-well sub-region 210_a, respectively.

A parasitic NPN transistor Q2 is shown with an emitter formed by the N+ region 252 (i.e., source of the NMOS transistor MN), a base formed by the P-type substrate 200 and the P-well sub-region 210_a, and a collector formed by the N-well region 220_2.

If the PNP transistor Q1 or the NPN transistor Q2 is turned on when one of the PN junctions in the transistor Q1/Q2 is forward-biased, this may cause unwanted latch-up in the SRAM structure 30A and, in some cases, even permanently damage the SRAM 30.

In FIG. 5, a guard ring is formed by the P-well sub-region 210_a, and the guard ring is capable of blocking a current (e.g., leakage current) from the N-well regions outside the SRAM structure 30A to the N-well region 220_2, thereby preventing such a current from turning on the PNP transistor Q1 or the NPN transistor Q2. Therefore, when the SRAM structure 30A is arranged adjacent to the N-well regions of other circuits/devices on the P-type substrate 200, the latch-up issue caused by the leakage current from the N-well regions outside the SRAM structure 30A is prevented by the P-well sub-region 210_a. Specifically, the P-well sub-region 210_a is configured to reduce noise interference from other external N-well regions to the N-well regions 220_1 through 220 (n+1) shown in FIG. 3.

In some embodiments, more P-well pick-up regions 215 are arranged in the P-well sub-regions 210_a and 210_b. When the number of P-well pick-up regions 215 is increased, the resistor $R_{PW}$ is decreased, making it difficult for the leakage current in the P-well region 210A to turn on the NPN transistor Q2.

Figure 6:
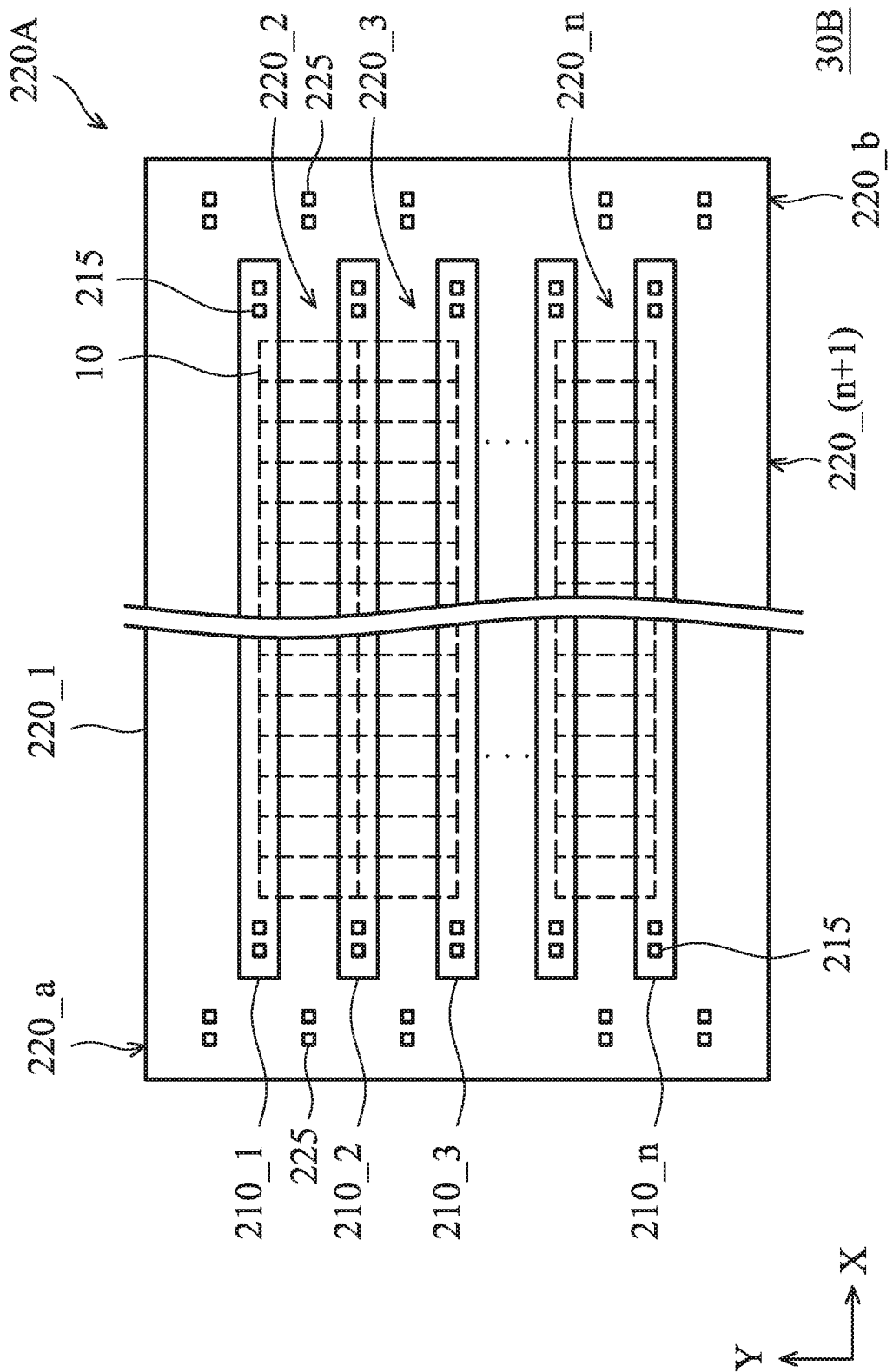
FIG. 6 shows a schematic top view of an SRAM structure including a plurality of layers involved in the SRAM of FIG. 1, in accordance with some embodiments of the disclosure.

FIG. 6 shows a schematic top view of an SRAM structure 30B including a plurality of layers involved in the SRAM 30 of FIG. 1, in accordance with some embodiments of the disclosure. The layers of FIG. 6 are formed on a semiconductor substrate.

The SRAM structure 30B includes a N-well region 220A, multiple P-well regions 210_1 through 210_n, and multiple SRAM cells 10. The N-well region 220A is divided into multiple N-well sub-regions 220_1 through 220 (n+1) and the N-well sub-regions 220_a and 220_b.

The P-well regions 210_1 through 210_n and the N-well sub-regions 220_1 through 220 (n+1) are formed in a semiconductor substrate, and extend parallel in a X-direction. The SRAM cells 10 are formed on the P-well regions 210_1 through 210_n and the N-well sub-regions 220_2 through 220_n. Furthermore, a quantity of P-well regions 210_1 through 210_n and a quantity of N-well sub-regions 220_1 through 220 (n+1) shown in FIG. 6 are merely an example and are not intended to be limiting the actual structure of the SRAM 30. In order to simplify the description, the edge cells 20A and 20B will be omitted in FIG. 6.

The P-well regions 210_1 through 210_n and the N-well sub-regions 220_1 through 220 (n+1) are interlaced in the semiconductor substrate. Furthermore, the N-well sub-regions 220_a and 220_b are formed in the semiconductor substrate, and extend parallel in a Y-direction. Specifically, the N-well sub-regions 220_a and 220_b are perpendicular to the N-well sub-regions 220_1 through 220_(n+1). Furthermore, the N-well sub-region 220_a is adjacent to the left side of the N-well sub-regions 220_1 through 220_(n+1), and the N-well sub-region 220_b is adjacent to the right side of the N-well sub-regions 220_1 through 220_(n+1).

In the SRAM structure 30B, each of the P-well regions 210_1 through 210_n is surrounded by the N-well region 220A. For example, the P-well region 210_1 is surrounded by the N-well sub-regions 220_1, 220_b, 220_2 and 220_a of the N-well region 220A, the P-well region 210_2 is surrounded by the N-well sub-regions 220_2, 220_b, 220_3 and 220_a of the N-well region 220A, and so on. Specifically, the P-well regions 210_1 through 210_n are separated from each other by the N-well region 220A.

The SRAM structure 30B further includes multiple P-well pick-up regions 215 on the P-well regions 210_1 through 210_n. Each P-well pick-up region 215 is an electrical connection made by one or more P-well contacts. The P-well contact is configured to connect to a ground terminal, such as a ground Vss. In such embodiments, the P-well pick-up regions 215 are arranged on both sides of the corresponding P-well region for each of the P-well regions 210_1 through 210_n.

The SRAM structure 30B further includes multiple N-well pick-up regions 225. Each N-well pick-up region 225 is an electrical connection made by one or more N-well contacts. The N-well contact is configured to connect to a positive voltage supply, such as a power supply node Vdd. For the N-well region 220A, the N-well pick-up regions 225 are arranged on the N-well sub-regions 220_a and 220_b. Furthermore, the N-well pick-up regions 225 are shared by the N-well sub-regions 220_a and 220_b and the N-well sub-regions 220_1 through 220_(n+1), and no N-well pick-up regions 225 is arranged on the N-well sub-regions 220_1 through 220_(n+1).

In some embodiments, more N-well pick-up regions 225 are arranged in the N-well sub-regions 220_a and 220_b. Thus, in the SRAM structure 30B, the number of P-well pick-up regions 215 is less than that of the N-well pick-up regions 225. Similarly, the N-well region 220A is capable of decreasing noise interference from other external P-well regions to the P-well regions 210_1 through 210_n.

Figure 7:
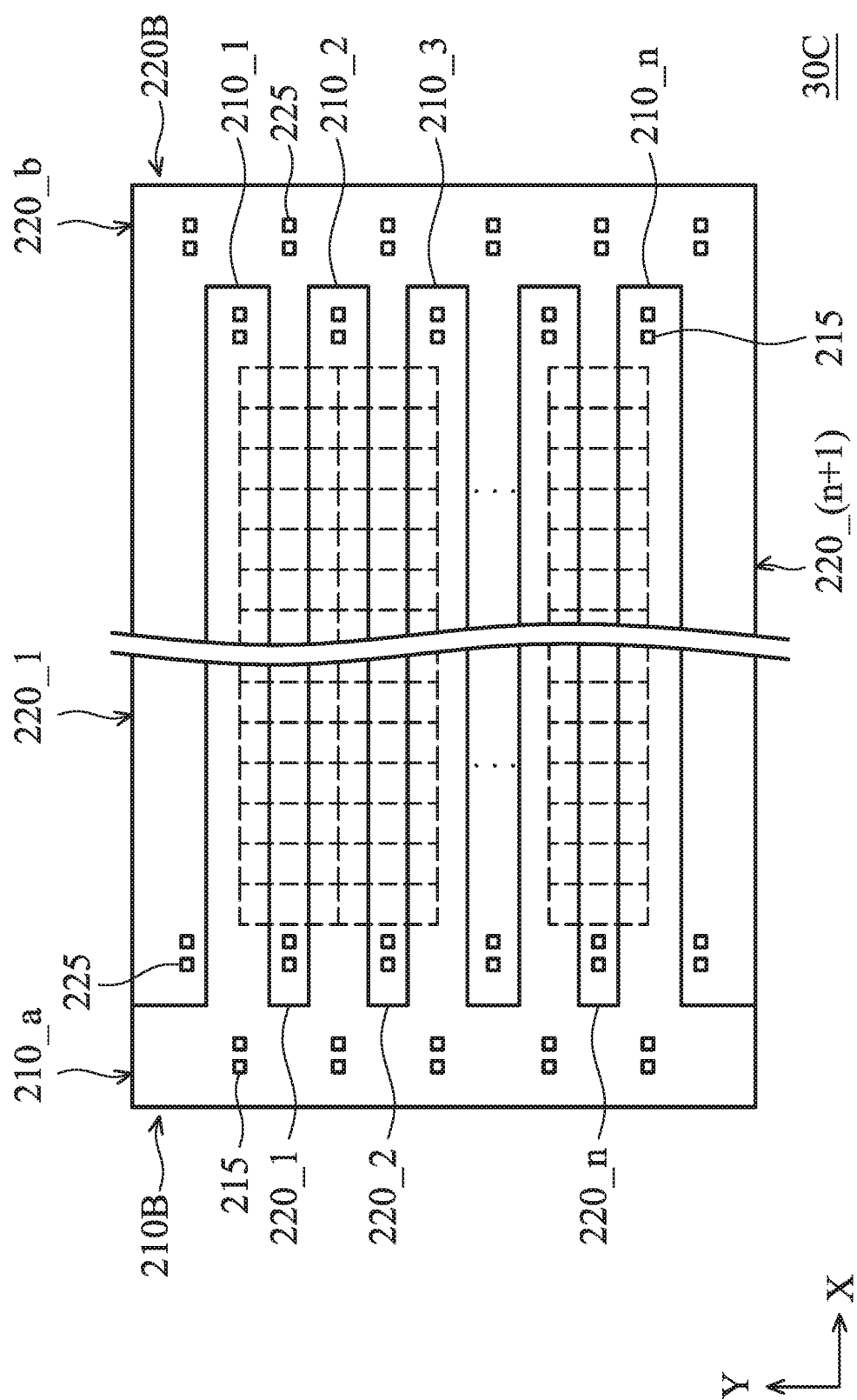
FIG. 7 shows a schematic top view of an SRAM structure including a plurality of layers involved in the SRAM of FIG. 1, in accordance with some embodiments of the disclosure.

FIG. 7 shows a schematic top view of an SRAM structure 30C including a plurality of layers involved in the SRAM 30 of FIG. 1, in accordance with some embodiments of the disclosure. The layers of FIG. 7 are formed on a semiconductor substrate.

The SRAM structure 30C includes a P-well region 210B, a N-well region 220B, and multiple SRAM cells 10. The P-well region 210B has a comb-shape in top view, and the comb-shaped P-well region 210B is divided into the P-well sub-regions 210_1 through 210_n and the P-well sub-region 210_a. The N-well region 220B has a comb-shape in top view, and the comb-shaped N-well region 220B is divided into the N-well sub-regions 220_1 through 220 (n+1) and the N-well sub-region 220_b.

The P-well sub-regions 210_1 through 210_n and the N-well sub-regions 220_1 through 220 (n+1) are formed in a semiconductor substrate, and extend parallel in a X-direction. The SRAM cells 10 are formed on the P-well sub-regions 210_1 through 210_n and the N-well sub-regions 220_2 through 220_n. Furthermore, a quantity of P-well sub-regions 210_1 through 210_n and a quantity of N-well sub-regions 220_1 through 220 (n+1) shown in FIG. 7 are merely an example and is not intended to be limiting the actual structure of the SRAM 30. In order to simplify the description, the edge cells 20A and 20B will be omitted in FIG. 7.

The P-well sub-regions 210_1 through 210_n and the N-well sub-regions 220_1 through 220 (n+1) are interlaced in the semiconductor substrate. In other words, the teeth (e.g., the P-well sub-regions 210_1 through 210_n) of the comb-shape P-well region 210B and the teeth (e.g., the N-well sub-regions 220_1 through 220_(n+1)) of the comb-shape N-well region 220B are interlaced. Furthermore, the P-well sub-region 210_a and the N-well sub-region 220_b are formed in the semiconductor substrate, and extend parallel in a Y-direction. Specifically, the N-well sub-region 220_b are perpendicular to the N-well sub-regions 220_1 through 220_(n+1), and the P-well sub-region 210_a are perpendicular to the P-well sub-regions 210_1 through 210_n. Furthermore, the P-well sub-region 210_a is adjacent to the left side of the P-well sub-regions 210_1 through 210_n. The N-well sub-region 220_b is adjacent to the right side of the N-well sub-regions 220_1 through 220_(n+1).

In the SRAM structure 30C, each of the P-well sub-regions 210_1 through 210_n is surrounded by the comb-shaped N-well region 220B. For example, the P-well sub-region 210_1 is surrounded by the N-well sub-regions 220_1, 220_b, and 220_2 of the comb-shaped N-well region 220B, the P-well sub-region 210_2 is surrounded by the N-well sub-regions 220_2, 220_b, and 220_3 of the comb-shaped N-well region 220B, and so on.

Each of the N-well sub-regions 220_2 through 220_n is surrounded by the comb-shaped P-well region 210B. For example, the N-well sub-region 220_1 is surrounded by the P-well sub-regions 210_1, 210_a, and 210_2 of the comb-shaped P-well region 210B, the N-well sub-region 220_2 is surrounded by the P-well sub-regions 210_2, 210_a, and 210_3 of the comb-shaped P-well region 210B, and so on.

The SRAM structure 30C further includes multiple P-well pick-up regions 215 on the P-well sub-regions 210_1 through 210_n and the 210_a. Each P-well pick-up region 215 is an electrical connection made by one or more P-well contacts. The P-well contact is configured to connect to a ground terminal, such as a ground Vss. In such embodiments, the P-well pick-up regions 215 are arranged on right side of the corresponding P-well sub-region for each of the P-well sub-regions 210_1 through 210_n. Furthermore, the P-well pick-up regions 215 are also arranged on the P-well sub-region 210_a. In some embodiments, the number of P-well pick-up regions 215 on the P-well sub-regions 210_1 through 210_n is less than the number of P-well pick-up regions 215 on the P-well sub-region 210_a.

The SRAM structure 30C further includes multiple N-well pick-up regions 225. Each N-well pick-up region 225 is an electrical connection made by one or more N-well contacts. The N-well contact is configured to connect to a positive voltage supply, such as a power supply node Vdd. In such embodiments, the N-well pick-up regions 225 are arranged on the left side of the corresponding N-well sub-region for each of the N-well regions 220_1 through 220_(n+1). Furthermore, the N-well pick-up regions 225 are also arranged on the N-well sub-region 220_b. In some embodiments, the number of N-well pick-up regions 225 on the N-well sub-regions 220_1 through 220_(n+1) is less than the number of N-well pick-up regions 225 on the N-well sub-region 220_b.

In such embodiments, the number of N-well pick-up regions 225 on the comb-shape N-well region 220B is different from the number of P-well pick-up regions 215 on the comb-shape P-well region 210B. In some embodiments, the number of N-well pick-up regions 225 on the comb-shape N-well region 220B is equal to the number of P-well pick-up regions 215 on the comb-shape P-well region 210B.

As described above, the N-well sub-region 220_b is capable of decreasing noise interference (e.g., leakage current) from external P-well regions located to the right of the N-well sub-region 220_b to the P-well sub-regions 210_1 through 210_n. Furthermore, the P-well sub-region 210_a is capable of decreasing noise interference (e.g., leakage current) from external N-well regions located on the left of the P-well sub-region 210_a to the N-well sub-regions 220_1 through 220_(n+1).

In some embodiments, according to the dopant type of the external well region of other circuits, the dopant type of well sub-regions that extend parallel in a Y-direction can be determined.

Embodiments for SRAM structures are provided. Multiple N-well regions are parallel to multiple P-well regions. The N-well regions and the P-well regions are interlaced. Multiple SRAM cells are formed on the N-well regions and the P-well regions. In some embodiments, the N-well regions are surrounded by the P-well regions, a first P-well region and a second P-well region that form a ladder-shaped P-well region, and the first and second P-well regions are perpendicular and adjacent to the P-well regions. Furthermore, multiple N-well pick-up regions are formed on the N-well regions, and multiple P-well pick-up regions are formed on the first and second P-well regions. The ladder-shaped P-well region is configured to provide a guard ring for preventing latch-up issue in the SRAM structure and blocking noise for the N-well regions. In some embodiments, the P-well regions are surrounded by the N-well regions, a first N-well region and a second N-well region, and the first and second N-well regions are perpendicular and adjacent to the N-well regions. Furthermore, multiple P-well pick-up regions are formed on the P-well regions, and multiple N-well pick-up regions are formed on the first and second N-well regions. The whole N-well regions are configured to provide a guard ring for preventing latch-up issue in the SRAM structure and blocking noise for the P-well regions. In some embodiments, the N-well regions and a first N-well region form a comb-shaped N-well region, and the teeth of the comb-shaped N-well region are formed by the N-well regions. The P-well regions and a first P-well region form a comb-shaped P-well region, and the teeth of the comb-shaped P-well region are formed by the P-well regions. Furthermore, multiple P-well pick-up regions are formed on the P-well regions and the first P-well region, and multiple N-well pick-up regions are formed on the N-well regions and the first N-well region. The comb-shaped P-well region is configured to prevent latch-up issue in the SRAM structure and block noise for the N-well regions, and the comb-shaped N-well region is configured to prevent latch-up issue in the SRAM structure and block noise for the P-well regions.

In some embodiments, an SRAM structure is provided. The SRAM structure includes a plurality of first well regions with a first doping type, a second well region with a second doping type, a plurality of first well pick-up regions, a plurality of second well pick-up regions and a plurality of memory cells. The first well regions are formed in a semiconductor substrate. The second well region is formed in the semiconductor substrate. The first well pick-up regions are formed in the first well regions. The second well pick-up regions are formed in the second well region. Each of the memory cells is disposed on two adjacent first well regions and a portion of the second well region between the two adjacent first well regions. Each of the first well pick-up regions is disposed between two adjacent second well pick-up regions.

In some embodiments, an SRAM structure is provided. The SRAM structure includes a plurality of first-type well regions, a plurality of second-type well regions, a plurality of first well pick-up regions, a plurality of second well pick-up regions and a plurality of memory cells on the first-type well regions and the first group of the second-type well regions. The first-type well regions are formed in a semiconductor substrate and extend parallel in a first direction. The second-type well regions are formed in the semiconductor substrate and divided into a first group extend parallel in the first direction and a second group extend parallel in a second direction that is perpendicular to the first direction. The first well pick-up regions are formed in the first-type well regions. The second well pick-up regions are formed in the second group of the second-type well regions. The second well pick-up regions are shared by the first and second groups of the second-type well regions. Each of the first well regions is in contact with two of the first group of the second well regions. The number of the first well pick-up regions is less than the number of the second well pick-up regions.

In some embodiments, an SRAM structure is provided. The SRAM structure includes a plurality of first well regions with a first doping type, a plurality of second well regions with a second doping type, a pair of third well regions with the second doping type, a plurality of first well pick-up regions, a plurality of second well pick-up regions and a plurality of memory cells on the first and second well regions. The first well regions are formed in a semiconductor substrate. The second well regions are formed in the semiconductor substrate. The pair of third well regions is formed in the semiconductor substrate and on opposing sides of the second well regions. The first well pick-up regions are formed in the first well regions. The second well pick-up regions are formed in the pair of third well regions. Each of the first-type well regions is surrounded by two of the second well regions and the pair of the third well regions. Each of the second well regions is adjacent to at least one of the second well pick-up regions of the pair of the third well regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An SRAM structure, comprising:
a plurality of first well regions with a first doping type formed in a semiconductor substrate;
a second well region with a second doping type formed in the semiconductor substrate;
a plurality of first well pick-up regions formed in the first well regions;
a plurality of second well pick-up regions formed in the second well region; and
a plurality of memory cells, wherein each of the memory cells is disposed on two adjacent first well regions and a portion of the second well region between the two adjacent first well regions,
wherein each of the first well pick-up regions is disposed between two adjacent second well pick-up regions.

2. The SRAM structure as claimed in claim 1, wherein the second well region is divided into a plurality of first sub-regions, a second sub-region and a third sub-region, wherein the first sub-regions extend parallel in the first direction, and the second sub-region and the third sub-region extend parallel in a second direction that is perpendicular to the first direction.

3. The SRAM structure as claimed in claim 2, wherein the first well regions and the first sub-regions are interlaced.

4. The SRAM structure as claimed in claim 2, wherein the second well pick-up regions are formed on the second sub-region and the third sub-region.

5. The SRAM structure as claimed in claim 1, wherein the number of the first well pick-up regions is less than the number of the second well pick-up regions.

6. The SRAM structure as claimed in claim 1, wherein the first well regions are N-well regions and the first well pick-up regions are N-well pick up regions, wherein the second well region is a P-well region and the second well pick-up regions are P-well pick up regions.

7. The SRAM structure as claimed in claim 6, wherein PMOS transistors of the memory cells are formed on the first well regions, and NMOS transistors of the memory cells are formed on the second well region, wherein the first well pick-up regions form bulk terminals of the PMOS transistors, and the second well pick-up regions form bulk terminals of the NMOS transistors.

8. The SRAM structure as claimed in claim 1, wherein the first well regions are P-well regions and the first well pick-up regions are P-well pick up regions, and the second well region is an N-well region and the second well pick-up regions are N-well pick up regions.

9. The SRAM structure as claimed in claim 8, wherein PMOS transistors of the memory cells are formed on the second well regions, and NMOS transistors of the memory cells are formed on the first well regions, wherein the first well pick-up regions form bulk terminals of the NMOS transistors, and the second well pick-up regions form bulk terminals of the PMOS transistors.

10. An SRAM structure, comprising:
a plurality of first-type well regions formed in a semiconductor substrate and extend parallel in a first direction;
a second-type well region formed in the semiconductor substrate and divided into a plurality of first sub-regions and a plurality of second sub-regions, wherein the first sub-regions extend parallel in the first direction, and the second sub-regions extend parallel in a second direction that is perpendicular to the first direction, a plurality of first well pick-up regions formed in the first-type well regions;
a plurality of second well pick-up regions formed in the second sub-regions of the second-type well region; and
a plurality of memory cells on the first-type well regions and the first sub-regions of the second-type well region,
wherein each of the first well regions is in contact with two of the first sub-regions of the second-type well region.

11. The SRAM structure as claimed in claim 10, wherein the first-type well regions and the first sub-regions of the second-type well region are interlaced.

12. The SRAM structure as claimed in claim 10, wherein each of the first-type well regions is surrounded by the first sub-regions and the second sub-regions of the second-type well region.

13. The SRAM structure as claimed in claim 10, wherein the number of the first well pick-up regions is different from the number of the second well pick-up regions.

14. The SRAM structure as claimed in claim 10, wherein the first-type well regions are N-well regions and the first well pick-up regions are N-well pick up regions, wherein the second-type well region is a P-well region and the second well pick-up regions are P-well pick up regions.

15. The SRAM structure as claimed in claim 10, wherein the first-type well regions are separated by the first sub-regions of the second-type well region.

16. An SRAM structure, comprising:
a plurality of first well regions with a first doping type formed in a semiconductor substrate;
a second well region with a second doping type formed in the semiconductor substrate;
a plurality of first well pick-up regions formed in the first well regions;
a plurality of memory cells on the first well regions and a plurality of first sub-regions of the second well region; and
a plurality of second well pick-up regions formed in a second sub-region and a third sub-region of the second well region;
wherein the first well regions are separated by the first sub-regions of the second well region,
wherein each of the first sub-regions of the second well region is adjacent to at least one of the second well pick-up regions of the second and third sub-regions of the second well region.

17. The SRAM structure as claimed in claim 16, wherein the number of the first well pick-up regions is different from the number of the second well pick-up regions.

18. The SRAM structure as claimed in claim 16, wherein the first well regions are parallel to the first sub-regions of the second well region, and the first well regions and first sub-regions of the second well region are alternately arranged between the second and third sub-regions of the second well region.

19. The SRAM structure as claimed in claim 16, wherein the first well regions are N-well regions and the first well pick-up regions are N-well pick up regions, and the second well region is a P-well region and the second well pick-up regions are P-well pick up regions, wherein PMOS transistors of the memory cells are formed on the first well regions, and NMOS transistors of the memory cells are formed on the second well region, and the first well pick-up regions form bulk terminals of the PMOS transistors, and the second well pick-up regions form bulk terminals of the NMOS transistors.

20. The SRAM structure as claimed in claim 16, wherein the first well regions are P-well regions and the first well pick-up regions are P-well pick up regions, and the second well region is an N-well region and the second well pick-up regions are N-well pick up regions, wherein PMOS transistors of the memory cells are formed on the second well regions, and NMOS transistors of the memory cells are formed on the first well regions, wherein the first well pick-up regions form bulk terminals of the NMOS transistors, and the second well pick-up regions form bulk terminals of the PMOS transistors.

* * * * *